United States Patent [19]

Benoit-Gonin et al.

[11] 4,355,244

[45] Oct. 19, 1982

[54] DEVICE FOR READING A QUANTITY OF ELECTRIC CHARGES AND CHARGE-FILTER EQUIPPED WITH SAID DEVICE

[75] Inventors: Roger Benoit-Gonin; Jean-Luc Berger; Jean-Louis Coutures, all of Paris, France

[73] Assignee: Thomson-CSF, Paris, France

[21] Appl. No.: 52,931

[22] Filed: Jun. 28, 1979

[30] Foreign Application Priority Data

Jul. 4, 1978 [FR] France ............................ 78 19933

[51] Int. Cl.³ ........................................... H03K 3/353
[52] U.S. Cl. ............................ 307/304; 307/221 D; 307/238.8; 307/224 C; 307/225 C
[58] Field of Search ............... 307/304, 221 D, 238.8, 307/238, 220, 224 R, 224 C, 225 R, 225 C

[56] References Cited

U.S. PATENT DOCUMENTS

| | | | |
|---|---|---|---|
| 3,623,132 | 12/1970 | Green | 307/221 D |
| 3,648,063 | 3/1972 | Hoffman et al. | 307/238.8 |
| 3,868,516 | 2/1975 | Buss | 307/221 D |
| 3,877,056 | 4/1975 | Bailey | 307/221 D |
| 3,889,245 | 6/1975 | Gosney, Jr. | 307/221 D |
| 3,947,705 | 3/1976 | Emmons | 307/304 |
| 3,949,245 | 4/1976 | Emmons | 307/304 |
| 3,997,973 | 12/1976 | Buss | 307/304 |
| 4,080,581 | 3/1978 | Sakaue et al. | 333/166 |

Primary Examiner—Saxfield Chatmon, Jr.
Attorney, Agent, or Firm—Roland Plottel

[57] ABSTRACT

A device for reading a quantity of electric charges arriving at a point B. Two MOS transistors Q2 and Q3 are connected in series and with one terminal to point B. A capacitor $C_A$ is connected to a common point A of the two transistors. A transistor control circuit charges the capacitor $C_A$ from a low potential $V_{DD}$. The capacitor $C_A$ and the transistors Q2 and Q3 maintain a constant potential at the point B at the time of charge inflow. This results is a variation of potential at the common point A in accordance with the incoming charges at B. Thus, the variations of potential at point A is a measure of the charges arriving at point B.

11 Claims, 3 Drawing Figures

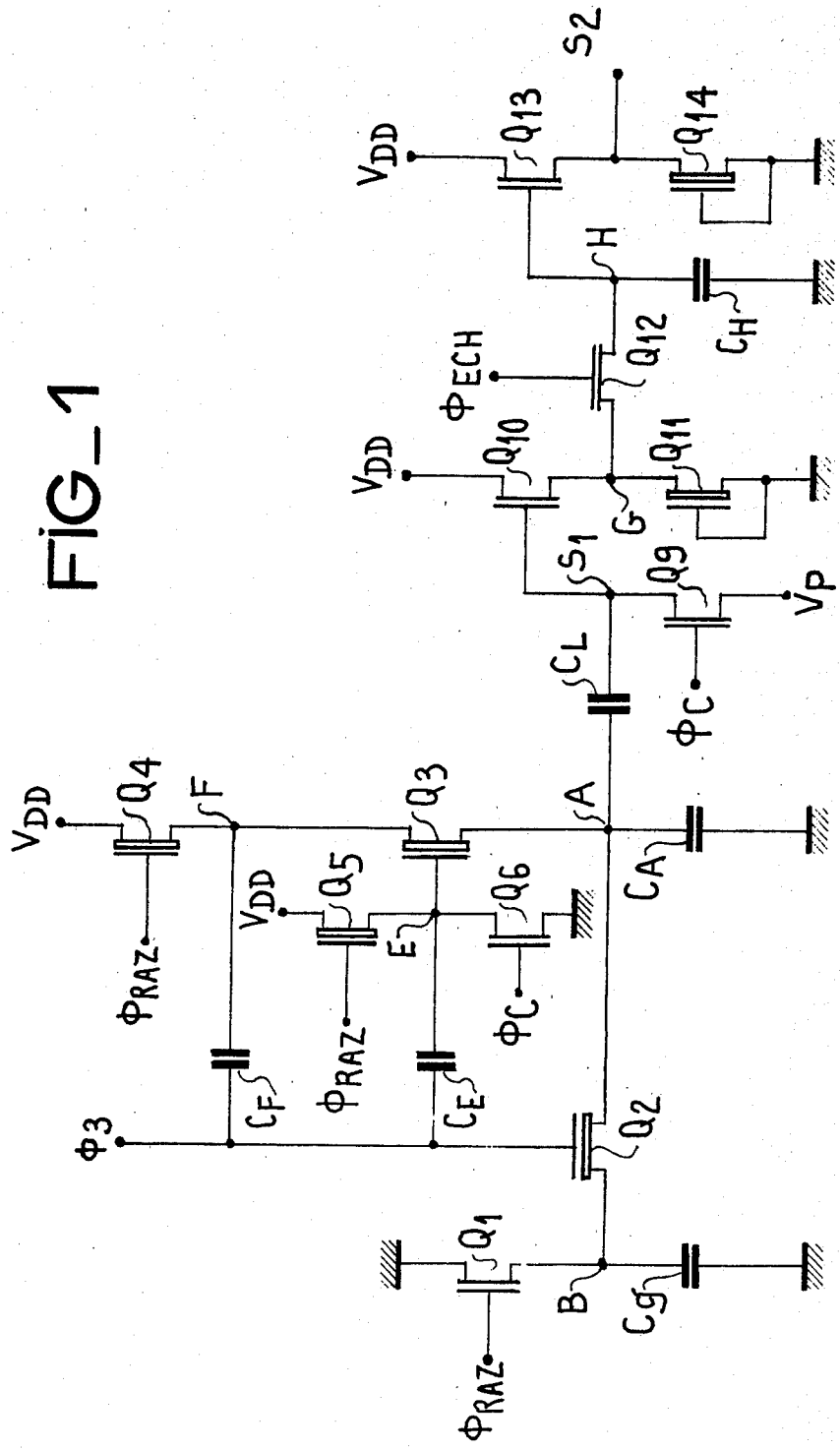
FIG_1

FIG_2
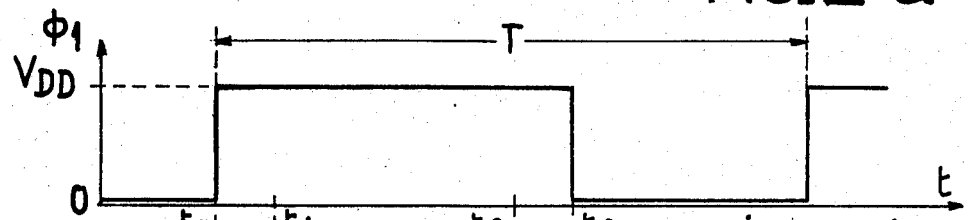
FIG.2-a
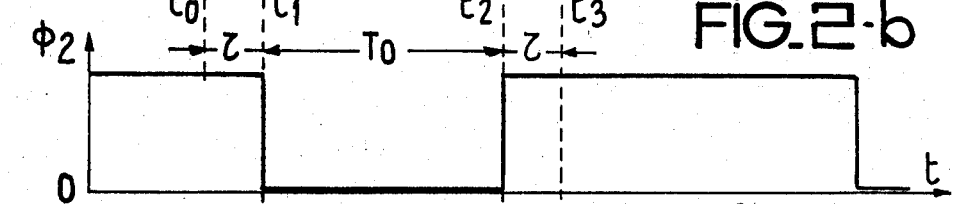
FIG.2-b
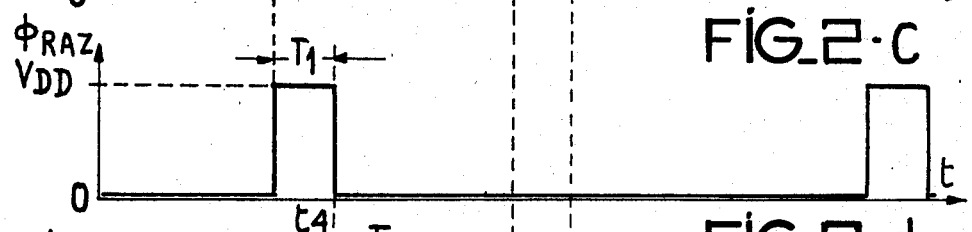
FIG.2-c
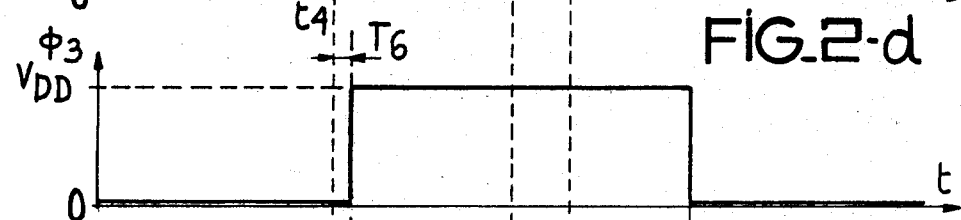
FIG.2-d
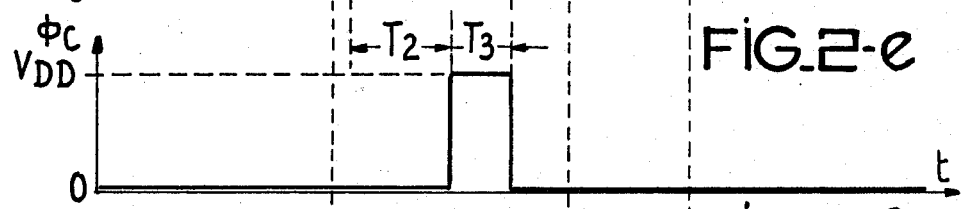
FIG.2-e
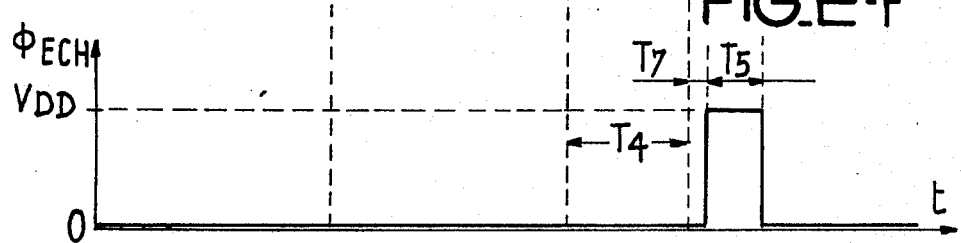
FIG.2-f

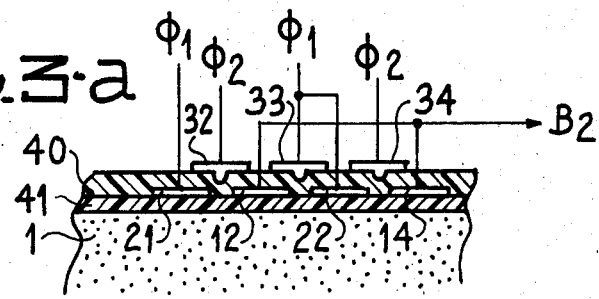
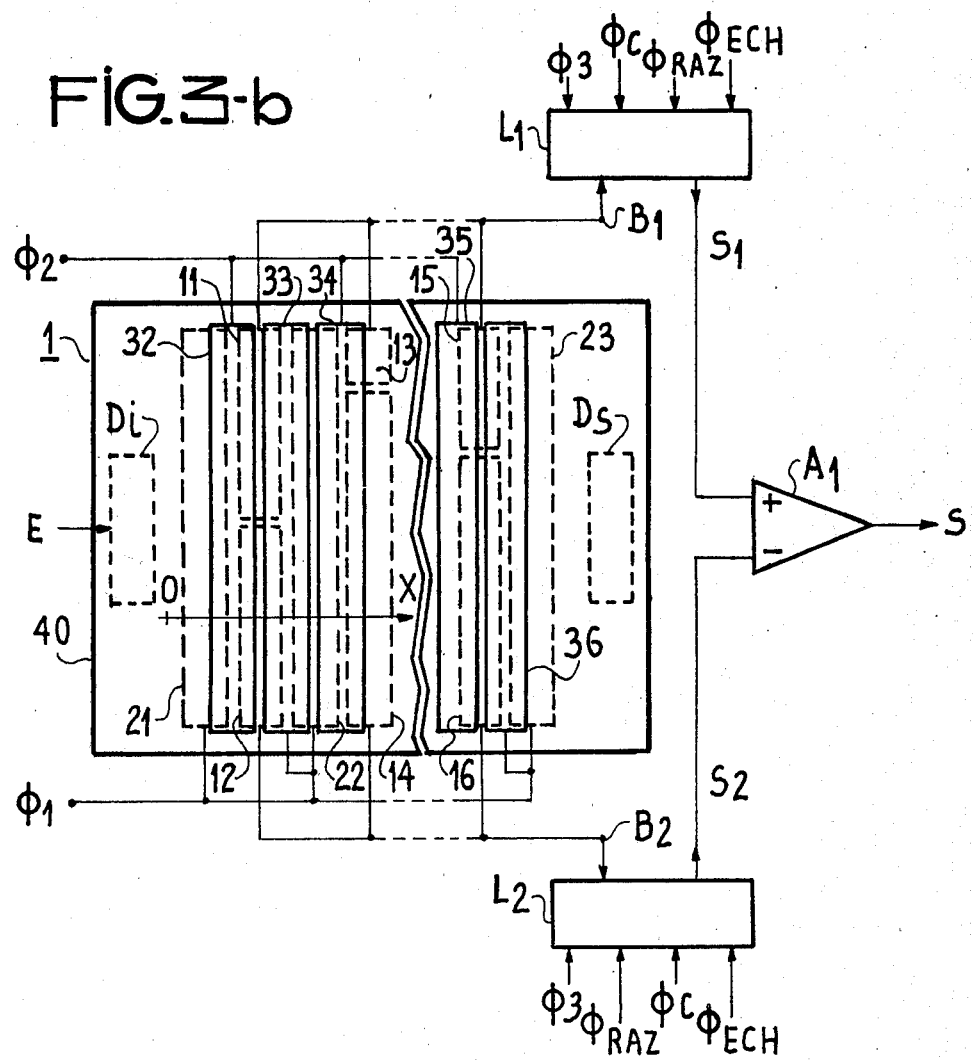

DEVICE FOR READING A QUANTITY OF ELECTRIC CHARGES AND CHARGE-FILTER EQUIPPED WITH SAID DEVICE

This invention relates to a device for reading a quantity of electric charges. It is primarily applicable to filters which utilize the transfer of electric charges in a semiconducting medium.

It is recalled that, in the case of filters of the so-called transversal type, a charge-transfer filter is constituted for example by a semiconductor substrate covered with an insulating layer on which electrodes are placed. By applying predetermined periodic potentials, these electrodes effect the transfer of packets of electric charges which represent the signal to be processed. The electrodes are arranged in parallel relation to each other and transversely with respect to the direction of charge transfer. A certain number of electrodes are divided into two unequal parts and the quantities of charges which arrive under these electrodes are read differentially in order to obtain weighting of the signal.

Reading of a quantity of charges under an electrode can be performed by two methods, viz:

a method known as voltage reading which consists of maintaining the electrode considered in an isolated state during the arrival of the charges and in observing the progressive variation in potential. It is already known that this method requires a high value of capacitance constituted by the substrate, the insulating layer and the electrode and therefore results in an output signal having low values. It may further be noted that the presence of space charges under the electrodes introduces non-linearities and that this method does not permit a high level of accuracy in the weighting coefficient mentioned earlier;

a so-called method of current reading or charge reading which consists in maintaining the potential of the electrode at a constant value and in integrating the current corresponding to arrival of the charges.

The method just described makes it possible to circumvent the disadvantages of voltage reading but entails the need for high-gain amplifiers in the known modes of applying this method. The disadvantages of these amplifiers include that they cannot readily be integrated on the same substrate as the filter and that they have a high power consumption.

This invention is directed to a stage for reading quantities of charges and for use in particular in a charge-transfer filter which can be integrated on the filter substrate without being subject to the disadvantages mentioned earlier.

In more exact terms, the device according to the invention mainly comprises:

two MOS-type transistors mounted in series and connected to the point (B) of arrival of electric charges;

a capacitor ($C_A$) connected to the common point (A) of the two transistors;

a circuit for controlling the two transistors, comprising three further MOS transistors and two further capacitors for charging the capacitor $C_A$ from a voltage having a relatively low value.

The two MOS transistors connected to the point B and the capacitor $C_A$ have the intended function of maintaining the potential of the point B at a constant value irrespective of the inflow of charges at that point. The variation in the quantity of charges at the point B is therefore represented by a variation in potential at the point A, which delivers the reading signal.

Further objectives, distinctive features and results of the invention will become apparent from the following description and from the accompanying drawings, wherein:

FIG. 1 shows one embodiment of the reading device according to the invention;

FIG. 2 shows a set of diagrams of signals applied to or delivered by the device according to the invention;

FIG. 3 is a sectional view looking from above and showing a known type of charge-transfer filter to which the device according to the invention is applied.

In these different figures, the same elements will be designated by the same reference numerals.

Shown in FIG. 1 are two transistors $Q_2$ and $Q_3$ of the MOS type, also designated as TMOS transistors, in which the common point (drain of $Q_2$ and source of $Q_3$) is designated by the reference A. Also connected to the point A a capacitor $C_A$, the other terminal of which is connected to the ground of the device. The other terminal (source) of the TMOS transistor $Q_2$ (point B) receives the quantity of charges to be measured through a capacitor $C_g$ which is connected between the point B and ground. In the event that the device shown in this figure is applied to a charge-transfer filter, the capacitor $C_g$ is formed by the electrode on which the reading is to be effected, the semiconductor substrate to which the charges are transferred and the insulating layer which separates these two elements. This takes into account the capacitance produced by the space charge zone which is formed within the semiconductor under the electrode considered.

The transistors $Q_2$ and $Q_3$ are controlled by a circuit which makes it possible by means of a single potential value $V_{DD}$ which is relatively low for this type of device (about 12 volts in a typical case) to obtain the charge of the capacitor $C_A$. To this end, the gate of the TMOS transistor $Q_2$ is connected to a signal $\phi_3$; the gate of the TMOS transistor $Q_3$ (point E) is connected to the same signal $\phi_3$ through a capacitor $C_E$; the drain of the transistor $Q_3$ (point F) is connected to the potential $\phi_3$ through a capacitor $C_F$ and to a fourth TMOS transistor $Q_4$, the other terminal and the gate of which are respectively connected to the constant potential $V_{DD}$ and to a periodic signal $\phi_{RAZ}$. There is connected to the point E a stage comprising two TMOS transistors $Q_5$ and $Q_6$ which are mounted in series (common point E) between the potential $V_{DD}$ and controlled respectively by the signals $\phi_{RAZ}$ and $\phi_c$.

The device of FIG. 1 has a system for resetting the complete assembly as designed in the form of a TMOS transistor $Q_1$ connected between the point B and ground and controlled by the signal $\phi_{RAZ}$ applied to the gate of said transistor.

The device has the following elements connected to the point A:

a capacitor $C_L$, one terminal of which is connected to the point A and the other terminal of which constitutes a connection point $S_1$;

a TMOS transistor $Q_9$ connected between a constant potential $V_p$ and the point $S_1$ controlled by the signal $\phi_c$.

The device also has an output stage connected to the point $S_1$. This output stage has five MOS transistors ($Q_{10}$ to $Q_{14}$) and a capacitor $C_H$. The TMOS transistors $Q_{10}$ and $Q_{11}$ are connected in series between the potential $V_{DD}$ (drain of transistor $Q_{10}$) and ground (source of transistor $Q_{11}$); the gate of transistor $Q_{10}$ is connected to the point $S_1$ and the gate of transistor $Q_{11}$ is connected to ground. One terminal of the TMOS transistor $Q_{12}$ is connected to the common point G of transistor $Q_{10}$ and transistor $Q_{11}$ and the other terminal of said transistor $Q_{12}$ is designated by the reference H; the gate of transistor $Q_{12}$ is controlled by a signal $\phi_{ECH}$. The capacitor $C_H$ is connected between the point H and ground. The last two TMOS transistors ($Q_{13}$ and $Q_{14}$) are connected in a similar manner to the TMOS transistors $Q_{10}$ and $Q_{11}$ between the potential $V_{DD}$ and ground; their common point constitutes the output point $S_2$ of the device, the output signal being clearly collected between this point and ground.

In this embodiment, the TMOS transistors $Q_1$, $Q_6$, $Q_9$, $Q_{10}$, $Q_{12}$ and $Q_{13}$ are of the enrichment type whereas the TMOS transistors $Q_2$, $Q_3$, $Q_4$, $Q_5$, $Q_{11}$ and $Q_{14}$ are of the depletion type. However, the TMOS transistors $Q_{11}$ and $Q_{14}$ can be replaced by TMOS enrichment transistors provided that the gate in each case is no longer connected to the source but to the drain.

FIG. 2 shows the diagrams of signals which are applicable to the device of FIG. 1 as well as periodic signals (diagrams a and b) which can advantageously be the control signals for a charge-transfer filter to which the device of FIG. 1 can be applied, as illustrated in FIG. 3.

Diagram (a) represents a potential $\phi_1$ having a period T and an amplitude which varies between 0 and $V_{DD}$ substantially in square waves. The time-duration of the upper square wave, however, is longer by $2\tau$ than the time-duration $T_o$ of the lower square wave.

Diagram (b) represents a potential $\phi_2$ having the same shape and period as $\phi_1$ but having a phase-lag with respect to $\phi_1$ of $(\tau+T_o)$.

Diagram (c) represents the potential $\phi_{RAZ}$ having a period T which is equal to $V_{DD}$ during a time interval $T_1$ having a value for example in the vicinity of $T/8$, and in synchronism with the trailing edge of $\phi_2$ (instant $t_l$).

Diagram (d) represents the potential $\phi_3$ having a period T which is equal to $V_{DD}$ during a time interval which is shorter than $(T-T_o)$ by a quantity $T_6$, and having a phase lag of $T_1+T_6$ with respect to $\phi_{RAZ}$.

Diagram (e) represents the potential $\phi_c$ having a period T equal to $V_{DD}$ during a time interval $T_3$ having a value for example in the vicinity of $T_1$ with a phase lag of $T_2$ on $\phi_3$ so as to revert to zero at the instant $t_2$ of the leading edge of $\phi_2$.

Diagram (f) represents the potential $\phi_{ECH}$ having a period T which is equal to $V_{DD}$ during a time interval $T_5$ having a value for example in the vicinity of $T_1$, with a slight phase lag ($T_7$) on the trailing edge of $\phi_3$.

By way of example, the period T can be of the order of one microsecond to a few tens of microseconds.

The operation of the device shown in FIG. 1 is as follows:

The design function of the TMOS transistors $Q_2$ and $Q_3$ is to establish the potentials at the points A and B of the circuit.

After the instant $t_1$ at which the potential $\phi_2$ returns to zero, the signal $\phi_{RAZ}$ is applied for a time-duration $T_1$. This signal $\phi_{RAZ}$ has the effect of removing the charges which are present at the level of the capacitor $C_g$. Said signal $\phi_{RAZ}$ also has the effect of pre-charging the points B and E at the voltage $V_{DD}$ through the TMOS transistors $Q_4$ and $Q_5$. Since the TMOS transistor $Q_2$ is then caused to cut-off by the control signal $\phi_3$, charging of the capacitors $C_E$ and $C_F$ is obtained.

At the instant $t_4$, the signal $\phi_{RAZ}$ returns to zero and cuts-off the TMOS transistors $Q_4$ and $Q_5$; and after a time-delay $T_6$ of the order of 20 to 50 ns, for example, the signal $\phi_3$ becomes equal to $V_{DD}$. This has the effect of bringing the points E and F to the voltage $2 V_{DD}$ while the capacitors $C_E$ and $C_F$ remain charged. The transistors $Q_2$ and $Q_3$ are then in the conducting state. The TMOS transistor $Q_3$ which then operates as a triode serves to bring the potential of point A to a value equal to that of point F, namely $2 V_{DD}$. In the TMOS transistor $Q_2$, a voltage $V_{DD}$ is applied to the gate and a voltage which is in fact slightly lower than $2 V_{DD}$ (by reason of the discharge from capacitor $C_F$ into capacitor $C_A$) is applied to the drain; said transistor $Q_2$ then operates in the saturating mode and the potential at point B is thus maintained at the value $V_{DD}-V_T$. At this value, the TMOS transistor $Q_2$ is no longer in the conducting state if $V_T$ designates the threshold voltage of the MOS transistor $Q_2$ which is assumed in addition to be equal to the threshold voltage of the other depletion-type TMOS transistors of the device. Pre-charging of point B as described in the foregoing therefore takes place during the time interval $T_2$.

During this same time interval, the final value ($V_o$) of the potential at A is:

$$V_o = C_A/(C_A+C_F) \cdot V_{AO} + C_F/(C_A+C_F) \cdot 2V_{DD}$$

where $V_{AO}$ is an initial voltage at A at the instant $t_o$ and $2 V_{DD}$ is the initial voltage on the capacitor $C_F$.

When the signal $\phi_c$ becomes equal to $V_{DD}$ during a time interval $T_3$, the TMOS transistor $Q_6$ is caused to conduct, thus discharging the capacitor $C_E$ and therefore causing the TMOS transistor $Q_3$ to cut-off.

The signal $\phi_c$ also drives the TMOS transistor $Q_9$, thus making it possible to bring the point $S_1$ of the capacitor $C_L$ to a reference potential $V_P$ prior to the instant $t_2$ of rising of the signal $\phi_2$. The potential $V_p$ is lower than or equal to $V_{DD}$. After the time interval $T_3$ and when $\phi_c$ has become zero, the potential at the terminals of $C_L$ becomes:

$$V_{CL} = V_{S1} - V_o = V_p - V_o \qquad (1)$$

At the instant $t_2$, the signal $\phi_2$ again becomes equal to $V_{DD}$ and then, after a time-delay $\tau$, the signal $\phi_1$ again becomes equal to zero (instant $t_3$). It is assumed that the admission of the quantity of charges to be measured into the capacitor $C_g$ takes place at said instant $t_3$, which is the case in a charge-transfer filter controlled by signals such as $\phi_1$ and $\phi_2$. Again in the case of a filter of this type, the arrival of a quantity of charges $Q_s$ under an electrode results of a reduction in potential at B. In the diagram of FIG. 1, this has the effect of turning on the TMOS transistor $Q_2$ and producing a current which tends to return the potential $V_{DD}-V_T$ to B, thereby turning-off transistor $Q_2$. To this end, the capacitor $C_A$ is discharged by a quantity of charges equal to the quantity of charges $Q_s$.

The potential at A is therefore reduced by a value $Q_s/C_A$ and becomes:

$$V_{A1} = V_o - Q_s/C_A \qquad (2)$$

The potential at $S_1$ becomes:

$$V_{S1} = V_{A1} + V_{CL}$$

which is written, considering equations (1) and (2):

$$V_{S1} = V_p - Q_s/C_A;$$

thereby making it possible to eliminate the term $V_o$ which is in turn dependent on the unknown term $V_{Ao}$.

The following stage constituted by the TMOS transistors $Q_{10}$ and $Q_{14}$ and the capacitor $C_H$ makes it possible to carry out sampling of the signal at $S_1$ and to maintain this latter with a low-impedance output at $S_2$.

The sampling operation is performed during a time interval $T_5$ which follows to within a few nanoseconds (time-lag $T_7$) the period $T_4$ during which the point A is discharged (the period $T_4$ ranges in time from the instant $t_3$ to the falling point of the signal $\phi_3$). The TMOS transistor $Q_2$ is then cut-off as a result of the signal $\phi_3$ returning to zero, thus preventing any variation at the point A during the sampling operation.

In this stage, the use of depletion-type TMOS transistors ($Q_{11}$, $Q_{14}$) as resistive elements has the advantage of permitting a low-noise output.

There has been described in the foregoing a device for current-reading of a quantity of charges which offers the following advantages in addition to those mentioned earlier:

operating voltages which do not exceed $V_{DD}$ (this value can be relatively low for this type of device and equal to 12 volts, for example) while biasing the TMOS transistor $Q_2$ in the saturating mode with the advantages thus provided for the potential of point B and, producing a substantial voltage swing at the point A:

$$V_o - (V_{\phi 3} - V_T) \neq V_{DD} - V_T \text{ if } C_F >> C_A.$$

This is made possible by the control circuit of the TMOS transistors $Q_2$ and $Q_3$ which makes it possible to obtain a potential at E during the time interval $T_2$;

sampling on a signal at A which is maintained constant and the value of which is independent of the initial state of the system.

Furthermore, different alternative forms can be contemplated on the basis of the embodiment described in the foregoing and among these can be mentioned the following:

insertion of a follower stage at A, this stage being formed by two TMOS transistors which are connected in the same manner as the TMOS transistors $Q_{10}$ and $Q_{11}$;

replacement of the TMOS transistors $Q_{10}$ by a depletion-type TMOS transistor in order to reduce harmonic distortion in the event that the voltage $V_p$ imposes at $S_1$ a mean value of the signal which is considerably lower than $V_{DD}$;

more generally, the replacement of enrichment-type TMOS transistors $Q_1$ and $Q_6$ by depletion-type TMOS transistors on condition that the amplitude of the signals $\phi_c$ and $\phi_{RAZ}$ is matched;

similarly, the replacement of the depletion TMOS transistors $Q_3$, $Q_4$ and $Q_5$ by enrichment TMOS transistors on condition that the amplitude of the drive signals $\phi_3$ and $\phi_{RAZ}$ is matched;

replacement of the single voltage $V_{DD}$ by different voltages at different points, especially for the drains of the TMOS transistors $Q_4$ and $Q_5$ (with $V_{DD4} < V_{DD5}$) in order to maintain operation of transistor $Q_3$ as a triode, thus permitting of wider latitude of adjustment of the voltage at the point F and therefore of the precharge voltage at A.

FIGS. 3(a) and 3(b) are diagrams of a transversal filter which makes use of a charge-coupled device (CCD) to which the device in accordance with the invention is applicable.

Filters of this type are known and described in particular in an article entitled "Transversal filtering using charge-transfer devices" published by IEEE, Journal of Solid-State Circuits (April 1973, Vol. SC 8, No 2, page 138). These filters are of the type comprising a shift register, the input signal being collected at the level of each stage and given a weighting coefficient, the different signals thus obtained being added in order to constitute the output signal of the filter.

The device comprises a semiconductor substrate 1 covered with an insulating layer 41 which is in turn covered with two levels of storage electrodes (11 to 16 and 21 to 23 in the figure) and transfer electrodes (32 to 36) which are isolated from each other by a layer 40. At both ends of the device, there is formed in the substrate 1 a diode designated respectively as $D_i$ and $D_s$ having the design function in the case of the first diode ($D_i$) of injecting into the substrate 1 a quantity of charges representing an input signal E in accordance with one of the known techniques and in the case of the second diode ($D_s$) of collecting the charges in order to remove them.

This device is shown in the overhead view of FIG. 3(b) and partly in section along the axis o—x of propagation of charges in FIG. 3(a).

The electric charges are transferred from $D_i$ to $D_s$ in a direction Ox by means of the above-mentioned electrodes which are placed at right angles to Ox and constitute the elements of a shift register. One storage electrode out of two (the electrodes 11–12, 13–14 and 15–16 in the figure) is divided into two portions in order to represent the weighting coefficient mentioned earlier. These divided electrodes are connected to the available signal at point B whereas the non-divided electrodes are connected to the signal $\phi_1$. On the second level are formed the transfer electrodes which are connected either to the signal $\phi_1$ or to the signal $\phi_2$.

It is known that, under operating conditions, a well-defined quantity of charges corresponding to the input signal E is transferred successively under each electrode as a result of application of the signals $\phi_1$ and $\phi_2$ to said electrodes. As they pass under each divided electrode (11, 12, 13, 14, 15 and 16), the charges are read by means of two devices designated respectively by the reference $L_1$ in the case of the half-electrodes 11, 13 and 15 which are all connected to a point $B_1$ corresponding to point B of FIG. 1 considered earlier, and by the reference $L_2$ in the case of the oppositely-facing half-electrodes 12, 14 and 16, these latter being connected to a point $B_2$ which is similar to $B_1$. In this diagram, the aforementioned capacitor $C_g$ is constituted by the electrode on which the reading operation is to be performed, by the insulating layer on which said electrode is deposited, and the semiconductor substrate.

The elements $L_1$ and $L_2$ each deliver a reading signal $S_1$ and $S_2$ respectively which supplies a differential amplifier $A_1$ and this latter delivers a signal S. This signal S therefore represents a sample of the filtered signal.

It is worthy of note that, in this case of application of the device of FIG. 1 to a transversal filter, the resetting mentioned earlier results in removal of the charges which are present beneath the cut electrodes, said charges being shifted to the uncut electrodes which are connected to the potential $\phi_1$ and intended to remain in this location up to the instant $t_3$.

The devices $L_1$ and $L_2$ according to the invention can readily be integrated in a charge-transfer filter. The use of these devices in turn makes it possible to integrate the filter and its ancillary reading elements on a single semiconductor substrate.

What is claimed is:

1. A device for reading a quantity of electric charges, comprising a first transistor ($Q_2$) and a second transistor ($Q_3$), each having source, drain and gate, said transistors being connected at a common point (A) with the drain of one transistor being connected to the source of the other transistor in series connection, said series being connected to a point (B) of arrival of the quantity of charges to be read, a first capacitor ($C_A$) having one terminal connected to the common point (A) of the two transistors ($Q_2$, $Q_3$), control circuit means connected to the gates of the two transistors ($Q_2$, $Q_3$) for charging the first capacitor ($C_A$) and for maintaining the first transistor ($Q_2$) in the saturating mode, and thus maintaining an essentially constant potential at the point of arrival (B) at the time of inflow of the charges, the effect of said inflow being to produce a variation in potential at the common point (A) and thereby delivering the reading signal at the common point (A).

2. A device for reading a quantity of electric charges, comprising a first transistor ($Q_2$) and a second transistor ($Q_3$), each having source, drain and gate with the drain of one transistor being connected to the source of the other transistor in series, said series connection being connected to a point (B) of arrival of the quantity of charges to be read, a first capacitor ($C_A$) having one terminal connected to the common point (A) of the two transistors ($Q_2$, $Q_3$), control circuit means connected to the gates of the two transistors ($Q_2$, $Q_3$) for charging the first capacitor ($C_A$) and for maintaining the first transistor ($Q_2$) in the saturating mode, and thus maintaining an essentially constant potential at the point of arrival (B) at the time of inflow of the charges, the effect of said inflow being to produce a variation in potential at the common point (A) and thereby delivering the reading signal at the common point (A); wherein the control circuit receives a first constant potential ($V_{DD}$) and comprises: a third transistor ($Q_4$) connected between said constant potential ($V_{DD}$) and a second terminal of the second transistor ($Q_3$); a fourth transistor ($Q_5$) and a fifth transistor ($Q_6$), said transistors being connected in series between the first constant potential ($V_{DD}$) and a reference potential of the device; a second capacitor ($C_E$) connected between the gate of the first transistor ($Q_2$) and a common point (E) of the fourth ($Q_5$) and fifth ($Q_6$) transistors, the gate of the second transistor ($Q_3$) being connected to said common point (E); a third capacitor ($C_F$) connected between the gate of the first transistor ($Q_2$) and a common point (F) of the second ($Q_3$) and third ($Q_4$) transistors.

3. A device according to claim 2, wherein a fourth capacitor ($C_g$) for the storage of charges is connected to the point of arrival (B).

4. A device according to claim 2, wherein said device further comprises a sixth transistor ($Q_1$) for resetting the device.

5. A device according to claim 2, wherein the transistors are of the MOS type.

6. A device according to claim 5, wherein the first transistor ($Q_2$) is of the depletion type.

7. A device according to claim 6, wherein the second, third and fourth transistors ($Q_3$, $Q_4$, $Q_5$) are of the depletion type.

8. A device according to claim 1 or 2 or 3 or 4 wherein said device further comprises a further capacitor ($C_L$) connected to the common point (A) of the first and second transistors ($Q_2$, $Q_3$), the other terminal ($S_1$) of said further capacitor being connected to a seventh transistor ($Q_9$) which permits pre-charging of the further capacitor ($C_L$) from a second constant potential ($V_p$) which is lower than or equal to the first constant potential ($V_{DD}$).

9. A device according to claim 8, wherein said device further comprises a circuit for sampling and maintaining the available signal at the common point ($S_1$) of the further capacitor ($C_L$) and of the seventh transistor ($Q_9$), the output signal of the device being delivered by said circuit.

10. A charge-transfer filter comprising a semiconductor covered with an insulating layer on which are placed electrodes for controlling the transfer of charges, wherein reading of a quantity of charges under an electrode is performed by means of a device according to claim 2.

11. A filter according to claim 3, wherein the storage capacitor ($C_g$) is constituted by the substrate, the insulating layer and the electrode under which the reading is performed.

* * * * *